United States Patent [19]

Innes et al.

[11] Patent Number: 5,444,309

[45] Date of Patent: Aug. 22, 1995

[54] REDUCED WATTAGE PLC INTERFACE

[75] Inventors: Mark E. Innes, Asheville; Rick A. Hurley, Fletcher, both of N.C.

[73] Assignee: Eaton Corporation, Cleveland, Ohio

[21] Appl. No.: 62,522

[22] Filed: May 14, 1993

[51] Int. Cl.[6] .................................. H03K 19/0175
[52] U.S. Cl. ................................... 307/125; 326/62
[58] Field of Search ............... 307/116, 125, 353, 475, 307/597; 318/778, 779, 781; 361/156

[56] References Cited

U.S. PATENT DOCUMENTS 4,263,521  4/1981  Senger ............................. 307/353
5,192,874  3/1993  Adams ............................. 307/125

*Primary Examiner*—A. D. Pellinen
*Assistant Examiner*—Jonathan Kaplan
*Attorney, Agent, or Firm*—Martin J. Moran

[57] ABSTRACT

A controller such as a programmable logic controller (PLC) is coupled to a load such as a contactor or motor starter through an interface that operates over a range of DC or AC voltage and couples a Start output of the controller to the load through a low current switch such as an opto-relay. The interface has a charging circuit coupled to the controller output, with a switching transistor, a load resistor and a capacitor in series. The low current switch is operated from accumulated charge in the capacitor and couples power to the load device. Charging of the capacitor to a threshold switches off of the transistor for an interval timed by a one-shot, during which the low current switch remains activated due to current draining from the capacitor. In an AC embodiment with a triac controller output, the capacitor continues to power the low current switch for the remainder of the positive AC half cycle, regardless of the triac, which may cease conduction due to lack of sufficient loading. The circuit substantially reduces the current dissipation of an interface between a PLC and a motor starter or contactor. The interface can include optically isolated signalling in both directions, including feed back of contact status and trip indications to inputs of the PLC.

15 Claims, 3 Drawing Sheets

REDUCED WATTAGE PLC INTERFACE

BACKGROUND OF THE INVENTION

1. Field of the Invention

The invention relates to the field of electrically interfacing a contactor device with a control apparatus such as a programmable logic controller or "PLC." In particular, the invention concerns a PLC/contactor interface adapted for operation over a range of PLC output voltages, either DC or AC, that provides status information for the PLC, and has a switching means that reduces power dissipation in the interface by a substantial amount.

2. Prior Art

Programmable logic controllers or PLCs are available with various types of input and output stages operable at AC or DC voltages. The outputs typically couple or decouple power to various operating elements. The operating elements can be, for example, contactors or starters for motors, actuators for hydraulic or pneumatic valves and various other devices that either are powered from the PLC outputs or include switching means that are triggered by the PLC outputs.

The PLC is programmed to activate its outputs in response to conditions at the PLC inputs. For example, the PLC inputs may sense the position of moving elements using limit switches or photocell pairs, sense a signal transmitted from a remote sensor device, or provide a communication path for data.

Where the operating element is a contactor such as a circuit breaker, it is often useful to couple an output signal from the contactor as an input of the PLC, in order to provide an indication of the status of the contactor. The PLC program cannot assume that the contacts are closed simply because an output signal has directed that they be closed, for example because the circuit breaker may be open due to overcurrent or undervoltage line conditions, or due to an interlock otherwise associated with the contactor or circuit breaker that has caused the contacts to be opened.

The circuitry needed to feed back an indication of the status of the contactor can be an expensive addition to the circuit. For example, a relay can be coupled in parallel with the load and in series with the contacts of the contactor to provide a status signal. A contactor also may have a built-in output to indicate its trip status and/or open-closed status. The trip output may be coupled to a bell alarm for generating an alert signal in the event the contactor is tripped. The bell alarm likewise is an additional expense. The open-closed status signal can be an input to the PLC that is tested to enable or disable switching of a further device whose operation may require that the load controlled by the contactor be powered (or perhaps not powered) due to the specific nature of the devices being controlled.

Some other problems with interfacing a contactor and a PLC are due to the AC aspects of operation. Some designers require isolation of the controls from the coil common of the contactor, for example using optical isolators between the PLC and the contactor circuits, to prevent electrical noise from being coupled into the logic circuits of the PLC and to protect the host/operator interfaces in the event of contactor failure. Additionally, many PLCs use solid state outputs to isolate control circuits from noise due to inductive surges that would occur with switching of inductive loads, and/or due to contact bounce. Whereas the PLC output may be at AC line voltage, a triac PLC output stage is often preferred to reduce inductive and contact bounce problems. The triac can be operable for switching the AC line voltage to the load at or near the point of zero voltage crossing.

A triac output, however, must be loaded. A minimum current draw must be maintained after the triac is switched on, in order to keep a triac in conduction. According to one technique, for example, the start/stop signal from a PLC to a contactor is coupled in parallel with a 2.5 KΩ, 7 Watt resistor to ensure that the triac remains loaded sufficiently to remain in conduction. At 120 VAC, the resistor dissipates energy at the rate of 5.76 Watts continuously. This is wasteful of electrical energy and contributes to the need for cooling in control enclosures and the like.

Another difficulty encountered in practical applications of PLC controllers is electromagnetic coupling between signal lines. A PLC may be wired in a plant or the like to control a motor starter or other device located hundreds of feet from the PLC. Signals in both directions between the PLC and the controlled device typically are routed over conductors in close proximity, through wire troughs and/or conduits. Capacitive and inductive coupling between the conductors may be such that a signal on one of the conductors is coupled to another. Optical couplers and solid state switching devices that are preferred to isolate the logic circuits from the line circuits are relatively fast switching devices. Typically the inputs do not require a great deal of input power. In the event that electromagnetic coupling induces a sufficient pulse on the line carrying a Start signal from the PLC to the controlled device, it is possible that the controlled device could be erroneously triggered. Coupling can be reduced by using shielded twisted pair wiring and by ensuring that the parallel runs of signal lines are relatively short. However, this can be expensive. Slower operating switching devices and higher input thresholds also are possible, but have obvious drawbacks with respect to the power requirements and operational characteristics of the system.

It would be advantageous to provide an interface circuit that satisfies the signalling and status reporting needs of a PLC interface as described, particularly for a starter or circuit breaker device that can be tripped, that keeps a PLC triac output true once it is switched on, that reduces the dissipation of electrical energy and heat, and that is insensitive to noise.

SUMMARY OF THE INVENTION

It is an object of the invention to provide a modular interface circuit for the output of a PLC, that meets requirements of signalling and circuit isolation, and dissipates minimal power.

It is another object of the invention to provide a PLC interface with a variable impedance arrangement, operable to decrease current loading of the PLC output during an AC cycle and thereby reduce the dissipation of electrical power and the generation of heat, but which keeps the PLC output true.

It is also an object of the invention to achieve the foregoing objects in an interface that is operable over a wide voltage range, e.g., from 12 to 120 V, and also is operable for either DC or AC outputs.

It is a further object of the invention to provide an interface that is relatively insensitive to noise.

These and other objects are accomplished by a controller such as a programmable logic controller (PLC) coupled to a load such as a contactor, motor starter or the like through an interface that operates over a range of DC or AC voltage and couples a Start output of the controller to the load through a low current switch such as an opto-relay. The interface has a charging circuit coupled to the controller output, with a switching transistor, preferably an FET, a load resistor and a capacitor in series. The low current switch is operated from accumulated charge in the capacitor and couples power to the load device. Charging of the capacitor to a threshold triggers switching off of the switching transistor for an interval timed by a one-shot, during which interval the low current switch remains activated due to current draining from the capacitor. In an AC embodiment with a triac controller output, the capacitor continues to power the low current switch for the remainder of the positive AC half cycle, regardless of the status of the triac, which may cease conduction due to lack of sufficient current loading. The circuit substantially reduces the current dissipation of an interface between a PLC and a motor starter or contactor. Furthermore, the series load resistor and the capacitor in parallel with the low current switch form an RC filter that reduces the sensitivity of the interface to noise induced in the conductor carrying the Start signal.

In the preferred embodiment, the interface couples the Start output of a PLC or other controller to a motor starter or contactor with circuit breaker (trip) functions, and couples a contact status signal and a trip status signal to inputs to the controller. The contact status signal is developed using contacts that are mechanically closed by a movable part of the starter or contactor. The trip status is a solid state switched output coupled to the PLC input.

A number of variations are possible, and will be apparent in connection with the following discussion, wherein certain examples of the invention are discussed in detail.

BRIEF DESCRIPTION OF THE DRAWINGS

There are shown in the drawings certain exemplary embodiments of the invention as presently preferred. It should be understood that the invention is not limited to the embodiments disclosed as examples, and is capable of variation within the scope of the appended claims. In the drawings.

DETAILED DESCRIPTION OF THE PREFERRED EMBODIMENTS

Figure 1:
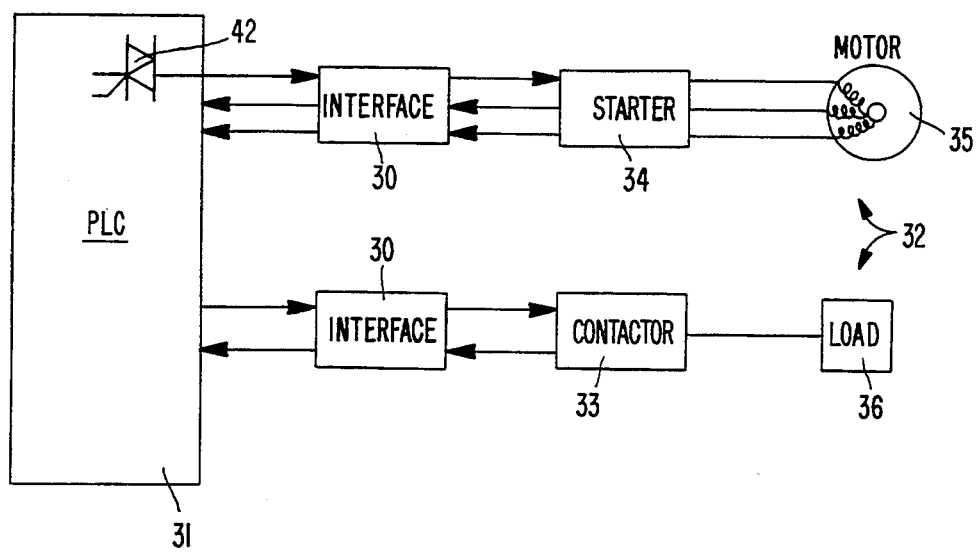
FIG. 1 is a functional block diagram showing a controller, interfaces and controlled devices according to the invention.

The invention comprises a modular circuit element 30 for interfacing between a controlling device 31 and a controlled device 32. The invention is described herein with reference to an interface between a contactor 33 and/or motor starter 34 arrangement (the controlled device) and a programmable logic controller or PLC 31 (the controlling device), as an example. The invention is applicable to controlling devices and controlled devices of all kinds, from simple manual pushbuttons or other controller means that generate a control signal, to full programmable control systems, and also to various forms of loads. However, the invention is described herein with respect to a PLC.

A PLC application for controlling a load, as shown in FIG. 1, is generally configured such that various status signals representing variables of an industrial process or the like are coupled to inputs of the PLC 31, and may be DC or AC signals or contact closures. The PLC 31 is programmed to activate its outputs (which also may be DC or AC outputs) to couple or decouple power to loads, to operate alarms or other signals, etc., according to a logical sequence. The programmed sequence is typically based on a plurality of inputs, and may involve Boolean logic functions based on the state of inputs and outputs of the PLC 31, counting or other mathematical functions, time delays and the like. The PLC 31 is aptly designed to enable control of a process having sensors and actuators for manipulating parts or machines in a logical sequence as needed to proceed with operations in an orderly manner.

A controlled device 32 may have an input such as a power input coupled to an output of the PLC 31, whereby power is switched on and off, and may generate an output that is coupled as an input to the PLC 31 to feed back information regarding the status of the controlled device 32. In FIG. 1, the controlled devices include a contactor 33 and a motor starter 34, either or both of which may include circuit breaking means. Westinghouse Electric Corporation Advantage line contactors are a preferred example of a controlled device 32 according to the invention.

With a starter-contactor controlled by the PLC 31, the program of the PLC generates a start signal at a PLC output, representing an "ON" command. Status signals representing the open/closed status of the contacts switching power to the load, and whether the contactor has tripped, are fed back to the PLC 31 to enable appropriate control functions to be effected based on power on the line that the contactor 33 switches to the load. The circuit breaker aspect of the contactor 33 is such that the contacts may be broken, for example due to sensed overcurrent or undervoltage conditions, even when the Start input to the contactor is true. In FIG. 1, the loads controlled by the PLC include a motor 35 coupled to the interface 30 of the invention and a generalized load 36, likewise coupled through an interface 30, which are intended as exemplary.

It is advantageous that the inputs and outputs of the PLC 31 be appropriately arranged to pass signals in either direction between the PLC 31 and the controlled device 32, and to avoid generating or coupling undue electrical noise. The PLC output is typically characterized by a triac 42 coupled between the power line and the device 32 to be controlled. The triac 42 requires that a minimum flow of current be maintained, in order to stay in conduction. The present invention provides an interface 30 operable for handling signalling and power coupling and isolation, and maintains the required state of the output, regardless of potential cessation of conduction by the triac due to low current loading. In addition, the interface 30 can operate at a wide range of DC or AC voltages.

The interface 30 of the invention has a number of functions in the coupling of power or signals between a PLC 31 or similar controller and a contactor/starter 33 or similar controlled device 32. These functions include:

1) Isolated normally-open signalling of the mechanical open/closed status of a contactor;
2) Isolated normally-open trip status for a breaker;
3) Isolated start signalling for a starter;
4) Current loading of a PLC triac output, with automatic impedance adjustment during AC cycles; and,
5) Operation at 12 to 125V, in DC or AC.

These functions provide a high degree of versatility, especially in a contactor arrangement including a motor starter 34 and circuit breaker. Groupings of interfaces 30 according to the invention can be employed, for example with two of the modular interfaces 30 used in connection with a reverser, and only one required in non-reversing starters. Additionally, the interface 30 is inexpensive enough to be useful in circuits that do not require all the functions that the interface makes possible, such as a contactor arrangement that is not arranged to trip and thus does not need to feed back a status signal representing a tripped condition.

Figure 2:
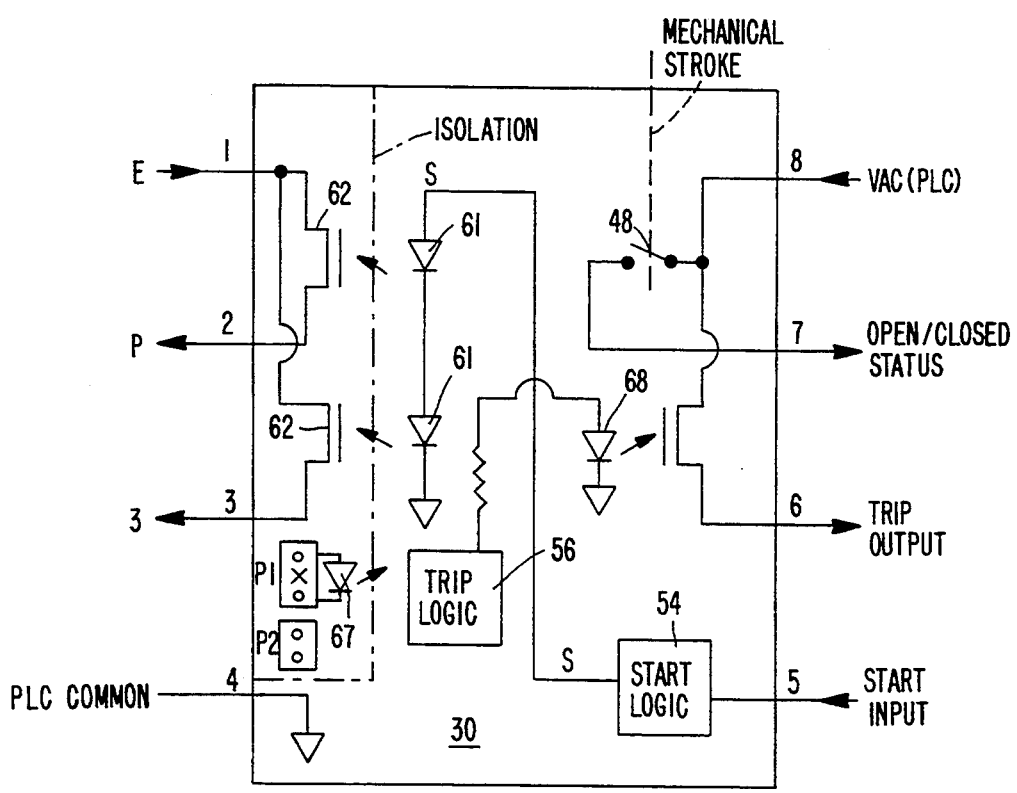
FIG. 2 is a block diagram showing a preferred configuration of an interface according to the invention, to be coupled to the controller and loads as shown in FIG. 1.

FIG. 2 is a functional block diagram showing the interface circuit 30 according to the invention. Preferably the circuit is mounted in a modular arrangement and can have an eight lead configuration with input/output lines including:

1) The input to the starter/contactor, designated VAC "E", nominally 150 VAC maximum;
2) An output permissive command "P" that is solid state switched from VAC E;
3) An output start command "3" that is solid state switched from VAC E;
b 4) The PLC common;
5) An input from the PLC, designated as continuous start command "3+P" that is rated for 12-125 VAC/DC and has a variable impedance to PLC common;
6) An output trip state indication of a switched solid state type;
7) An output for open/Closed state indication of a mechanical contact type; and,
8) Input PLC power at 12-125 VAC/DC, with a maximum current draw of 10 mA.

There are two ports on the module. One port brings remote reset and trip indication to the module (e.g., from another contactor Dr module that is coupled to operate in a coordinated manner with the present contactor), and uses three switched lines. Another port couples the remote reset and trip indication through the interface 30, as if the module were not in the circuit, having two leads, switched by mechanical contacts.

Two signals are fed back to the PLC host 31. The first is a mechanically coupled open/closed state contact signal. This signal is useful to applications control engineers to verify that the contactor unit 33 is in fact closed. The VAC PLC input to the interface module 30 is coupled through a normally open contact 48 in the interface module 30 to the output for open/closed state indication. This contact 48 is closed by mechanical contact due to motion of the cross of the contactor 33, which moves a stroker to deflect the contact 48 and close the circuit. In this manner, VAC is coupled to an input of PLC 31. Typically, inputs at line voltage are coupled to the PLC 31 via an input interface card of the PLC (not shown), which is arranged to handle the voltage level and/or AC-DC character of the power supply voltage.

The other signal fed back to the PLC host is the trip state. This signal can be derived, for example, from the remote reset and trip signal generated by a Westinghouse Advantage type contactor, or in a similar manner.

Figure 3:
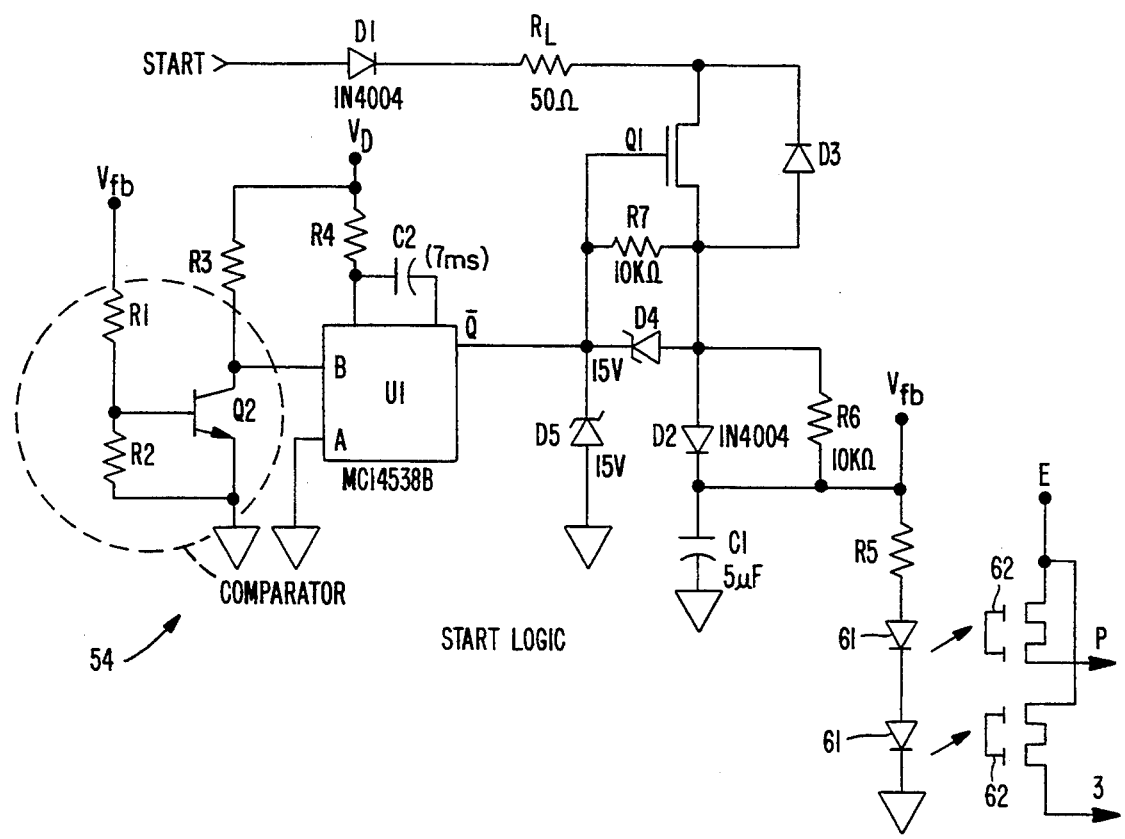
FIG. 3 is a schematic diagram showing the start logic circuits of the interface of the invention, in detail.
Figure 4:
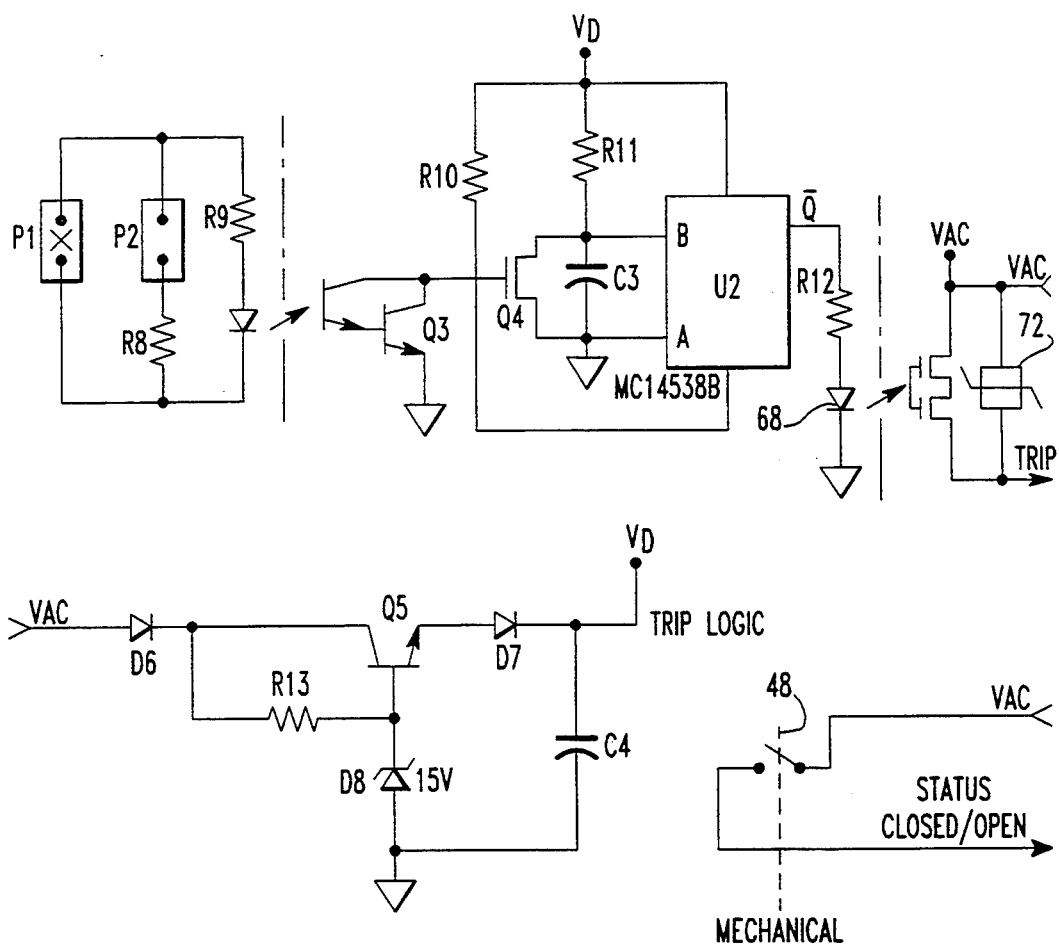
FIG. 4 is a schematic diagram showing the trip logic circuits and power supply for the interface.

The circuit according to the invention is shown in further detail in FIGS. 3 and 4. FIG. 3 shows the start logic represented by block 54 in FIG. 2, and FIG. 4 shows the trip logic represented by block 56. Referring to FIG. 3, there is a single start/stop signal input to the interface module 30 from the output of the PLC 31. This signal can be AC or DC, from 12 to 125 volts. Whereas many PLC output configurations use triacs, and normally require a minimum current loading to keep the triac conducting, an impedance is coupled between the start/stop signal and ground or PLC common. To minimize power consumption, according to the invention this impedance is coupled to the start signal by a blocking diode D1, and is arranged to increase with the charging of capacitor C1, and ultimately to be switched off by transistor Q1.

During negative AC cycles the impedance is large due to reverse biasing of at least one diode in series with the impedance. During positive cycles the impedance varies, and is arranged according to the invention to increase substantially following the beginning of a positive AC half cycle. Normally, it is necessary to continue to load the triac output of a PLC throughout its cycle, such that the triac does not cease conducting for the remainder of an AC half cycle, thus dropping the start signal to the contactor 33 or motor starter 34. The invention reduces the current loading on the PLC output by storing sufficient charge in capacitor C1 at the beginning of an AC half cycle to maintain the P and 3 outputs through optical relays 61, until the next positive AC half cycle, when (assuming the start command remains true) capacitor C1 charges again.

At the beginning of a positive half cycle, the start logic circuit 54 presents a relatively smaller impedance across the input, for example 50Ω. In the circuit shown in FIG. 3, this initial impedance is substantially equal to the resistance of resistor $R_L$ because transistor Q1 is conducting and capacitor C1 is not charged. Capacitor C1 charges exponentially at a time constant defined by $R_L$ and C1.

Capacitor C1 is coupled to the two opto-relays 61, via current limiting resistor R5. So long as the voltage on capacitor C1 is more than two forward-biased diode drops, current flows through the opto-relays 61. A minimal amount of current is needed to turn on the FETs coupling voltage E to outputs P and 3, which maintains the true status of the start output even if the triac output of the PLC 31 ceases conducting.

During the early part of the positive half cycle, capacitor C1 charges to the point where the circuit has sufficient stored charge to maintain a positive voltage at logic levels sufficient to operate the opto relays 61 such that the inputs to the starter/contactor are maintained, such as a Westinghouse Advantage contactor, until the next positive half cycle arrives and the capacitor C1 is again charged. Thus, the triac output of the PLC 31, that provides the Start signal, does not have to remain on, and the impedance of the load defined by the interface circuit can be increased, namely by turning off transistor Q1, in series between the Start input, diodes D1 and D2, and capacitor C1. The contactor remains on, because the charge on capacitor C1 is sufficient to keep the opto-relays conducting.

The interface circuit 31 monitors the voltage across capacitor C1 and affirmatively decouples the interface impedance from the PLC output when a predetermined level of charge is reached. Capacitor voltage $V_{fb}$ is coupled via the voltage divider of resistors R1 and R2 to the base of switching transistor Q2. Transistor Q2 is biased to the positive DC supply $V_D$ by resistor R3 on the collector of transistor Q2, which is also coupled to a trigger input of a flipflop U1, configured as a one-shot. The voltage divider of R1/R2 and transistor Q2 act as a comparator coupled by one-shot U1 to switching transistor Q1, and to capacitor C1 (i.e., voltage $V_{fb}$), this comparator being operable to switch switching transistor Q1 off when capacitor C1 charges to a predetermined voltage sufficient to produce a voltage on resistor R2 exceeding the forward biased base-emitter voltage of transistor Q2. When the voltage at the base of transistor Q2 exceeds about 0.7V, transistor Q2 turns on and pulls the trigger input of the one-shot U1 low. The low true output of flipflop U1 then goes low, and transistor Q1 is turned off. The length of the one-shot pulse is set by resistor R4 and capacitor C2, to about 7 mS. The time delay prevents FET Q1 from staying in the linear mode for the entire positive half cycle. The time delay can expire at about the beginning of the negative half cycle on the Start input, since diode D1 will block current in that direction.

Assuming a worst-case leakage of about 1 mA, it is estimated that about 0.022μF is being used to snub the triac 42 on the PLC output, which generated the Start signal. That value translates to a 60 Hz impedance of about 120KΩ. In this condition, only about 120*(50/112050=0.05V will appear at the input. The circuit requires about 3 mA to operate, so the 1 mA leakage can be ignored.

The circuit therefore draws minimal current, and is not adversely affected by the tendency of a triac 42 to cease conduction at low current loading levels. Whereas a 2.5KΩ load resistor would draw 5.76 W continuously at 120VAC, the present circuit draws only a fraction of a watt. The circuit of the invention requires about 0.3 mS to charge the capacitor to a maximum level. If one estimates assuming that all 33V is dropped across 50Ω resistor $R_L$, and that the whole 33V is present continuously during the 0.3 mS, the average power consumption over a 60 Hz cycle would be only 0.4 W. The actual dissipation is less.

The arrangement is also insensitive to noise on the conductor carrying the Start signal from the PLC output to the interface 30. Resistor $R_L$ (and the resistance of D1, D2 and Q1 when conducting) forms an RC filter or integrator with capacitor C1. This RC filter is coupled between the Start input and the output stage defined by opto-relays 61. Thus a noise signal induced in the Start signal, for example due to electromagnetic coupling between the Start signal line and a conductor that may be routed alongside the Start signal line over a distance between the PLC and the interface 30, is capacitively decoupled or filtered by the start logic and is less likely to spuriously trigger the output.

In the embodiment shown in FIG. 3, zener diodes D4 and D5 clamp the output of the one-shot U1 between 0 and 15V, and prevent the one-shot output from driving the opto-relays 61. Resistors R6 and R7 bias the switching circuit comprising FET Q1, and diode D3 is a protective element. Resistor R6 also couples current from FET Q1 to the output circuit defined by resistor R5 and the two opto-relays 61, when FET Q1 is conducting.

FIG. 4 shows the manner in which the mechanically driven contact closure verification and the trip state indication are fed back to inputs of the PLC as part of the trip logic block 56 shown in FIG. 2. FIG. 4 also shows the series regulator circuit that provides supply voltage $V_D$.

Contactor contacts P1 and P2 are coupled to an opto-relay 67 via resistors R8 and R9, and in the event of a trip turn on Darlington pair Q3 to pull down the voltage at the gate of FET Q4, which is coupled to the positive $V_D$ supply via resistor R10. This turns off FET Q4, allowing capacitor C3 to charge through resistor R11. FET Q4 otherwise drains any charge in capacitor C3. When Q4 is turned off, capacitor C3 charges to a sufficient voltage to trigger flipflop U2, causing its low-true output to go high. An opto-relay 68 coupled to the output of flipflop U2 is activated via current limiting resistor R12. This couples the PLC VAC to the TRIP output, and changes the state of a solid state relay 72 coupled in parallel with the switching FET of the opto-relay 68. In this manner, an e.g., 120 VAC signal is produced at TRIP, and a switched solid state output is produced at the outputs of the solid state relay (this output not being shown in the drawing).

For feeding back the open/closed status of the contacts, a mechanical contact 48 is provided and is arranged to interact with a movable part of the contactor 33. This movable part closes or opens contact 48 to signal the position of the mechanically movable contactor elements.

The power supply for $V_D$ can be a standard series regulator. Diode D6 is a half wave rectifier coupled to the collector of series transistor Q5, whose base is coupled to current supply resistor R13. The voltage at the base of transistor Q5 is fixed by zener diode D8, and the voltage at $V_D$ is maintained at two diode drops lower, from the base emitter junction of Q5 and diode D7, or at about 14.3V. Capacitor C4 stores the charge and reduces ripple.

The invention having been disclosed in connection with the foregoing variations and examples, additional variations will now be apparent to persons skilled in the art. The invention is not intended to be limited to the variations specifically mentioned, and accordingly reference should be made to the appended claims rather than the foregoing discussion of preferred examples, to assess the scope of the invention in which exclusive rights are claimed.

We claim:

1. An interface device for coupling between an output of a controlling device, the output carrying a Start command signal, and an input of a controlled device responsive to the Start command signal, comprising:

a load resistor and a capacitor in series with one another to define a charging circuit in parallel with the output carrying the Start command signal;

a switching circuit coupled in series with the charging circuit, the switching circuit having a switching transistor operable to charge the capacitor from the Start command signal when the Start command signal is present and the switching transistor is conducting;

a comparator coupled to the switching transistor and to the capacitor, the comparator being operable to switch the switching transistor off when the capacitor charges to a predetermined voltage and thereby to decouple the capacitor from further charging by the charging circuit; and, an output circuit coupled in parallel with the capacitor, the output circuit being operable to activate the controlled device from a voltage on the capacitor, for a period following switching off of the switching circuit;

whereby loading of the output of the controlling device is minimized.

2. The interface device according to claim 1, wherein the output of the controlling device carries an AC signal and further comprising a rectifier in series with the charging circuit, whereby the capacitor is charged during a part of a positive half cycle of the AC signal.

3. The interface device according to claim 2, wherein the period following switching off of the switching circuit is sufficient to activate the controlled device for a remainder of the positive half cycle, such that the controlled device remains activated during said period while decoupled from the Start command signal by the switching transistor.

4. The interface device according to claim 3, wherein the output circuit comprises at least one opto-relay coupled to the capacitor.

5. The interface device according to claim 2, wherein the comparator comprises a switching device having a threshold input coupled to the capacitor, and a one-shot triggered by the switching device, the one-shot producing a pulse operable to disable the switching transistor until an end of the positive half cycle.

6. In combination, a controller having an output at a voltage over at least part of a cycle, a load device, and an interface between the output of the controller and the load device for coupling power to the load device, comprising:

the interface including a charging circuit having a switching means, a load resistor and a capacitor in series with one another and in parallel with the output of the controller, a low current switching device having an input coupled to the capacitor and an output operable to couple power to the load device, the interface including means operable to switch off the switching means after a predetermined delay following a beginning of the cycle, the delay being long enough to charge the capacitor to a level sufficient to operate the low current switching device over a remainder of the cycle, whereby current loading of the output of the controller is minimized.

7. The combination according to claim 6, wherein the output of the controller is a triac circuit requiring a minimum operational current to remain in conduction, and wherein the cycle is an AC power cycle.

8. The combination according to claim 7, further comprising a rectifier in series with the charging circuit for charging the capacitor during a part of a positive half cycle of the AC power cycle, and comprising a timer for switching off the switching means for a remainder of the positive half cycle.

9. The combination according to claim 8, wherein the switching means comprises a transistor in series with the charging circuit, and a threshold device having an input coupled to the capacitor, the threshold device defining the predetermined delay following the beginning of the cycle by detecting charging of the capacitor to a threshold voltage, and a timing device coupled to an output of the threshold device, the timing device being triggered by the threshold device and being operable to switch off the transistor for a timed interval encompassing a remainder of the positive half cycle.

10. The combination according to claim 9, wherein the threshold device comprises a transistor switching circuit defining the threshold voltage, and wherein the timing device comprises a one-shot having a preset pulse width.

11. The combination according to claim 8, wherein the controller comprises a programmable logic controller having said triac output.

12. The combination according to claim 8, wherein the load device comprises one of an electrical contactor, a motor starter and a circuit breaker.

13. The combination according to claim 8, wherein the low current switching device comprises at least one opto-relay.

14. The combination according to claim 12, wherein the interface further comprises at least one means for coupling a status indication from the load device to the controller.

15. The combination according to claim 14, wherein the means for coupling the status indication includes a contact operated mechanically by a movable element of the load device and a solid state switched indication of a trip status of the load.

* * * * *